United States Patent [19]

Suzuki

[11] Patent Number: 4,920,505
[45] Date of Patent: Apr. 24, 1990

[54] PROJECTION EXPOSURE APPARATUS

[75] Inventor: Kazuaki Suzuki, Tokyo, Japan

[73] Assignee: Nikon Corporation, Tokyo, Japan

[21] Appl. No.: 390,482

[22] Filed: Aug. 2, 1989

Related U.S. Application Data

[63] Continuation of Ser. No. 938,610, Dec. 5, 1986, abandoned.

[30] Foreign Application Priority Data

Dec. 11, 1985 [JP] Japan .................................. 60-278277

[51] Int. Cl.$^5$ .............................................. G03B 27/52
[52] U.S. Cl. ...................................... 364/525; 355/55
[58] Field of Search ....................... 355/53, 30, 20, 55; 364/525, 550, 551.01, 571.04, 571.08; 356/373

[56] References Cited

U.S. PATENT DOCUMENTS

| 3,528,727 | 9/1970 | Halliday ................... 350/419 |
| 3,563,648 | 2/1971 | Baggaley et al. ................... 364/525 |
| 4,045,660 | 8/1977 | Weisgerber et al. ........... 364/474.35 |
| 4,471,447 | 9/1934 | Williams et al. ................... 364/525 |
| 4,506,977 | 3/1985 | Sato et al. ........................... 356/399 |
| 4,583,840 | 4/1986 | Yabu et al. .......................... 355/55 |
| 4,624,551 | 11/1986 | Anzai et al. .......................... 355/53 |
| 4,666,273 | 5/1987 | Shimizu et al. ...................... 353/101 |
| 4,668,077 | 5/1987 | Tanaka ................................. 355/30 |
| 4,676,631 | 6/1987 | Kosugi et al. ........................ 355/55 |
| 4,687,322 | 8/1987 | Tanimoto et al. ..................... 355/55 |
| 4,690,528 | 9/1987 | Tanimoto et al. ..................... 353/101 |
| 4,699,505 | 10/1987 | Komoriya et al. .................... 355/30 |
| 4,714,331 | 12/1987 | Oda et al. ............................ 353/101 |
| 4,730,900 | 3/1988 | Uehara et al. ........................ 350/253 |
| 4,780,747 | 10/1988 | Suzuki et al. .......................... 355/68 |
| 4,801,977 | 1/1989 | Ishizaka et al. ....................... 355/30 |

FOREIGN PATENT DOCUMENTS 0225812 11/1985 Japan .................................. 364/550

Primary Examiner—Parshotam S. Lall
Assistant Examiner—S. A. Melnick
Attorney, Agent, or Firm—Shapiro and Shapiro

[57] ABSTRACT

A projection exposure apparatus for manufacturing semiconductor elements has a control system for correcting changes in imaging characteristics with high precision on a real-time basis and for correcting imaging characteristics of a projecting lens on the basis of information associated with the history of light incident on the projection lens, wherein even if the history information of incident light is lost, due to a power failure, for example, or an error occurs in the information, correction control for the imaging characteristics can be restored with high precision.

11 Claims, 7 Drawing Sheets

PROJECTION EXPOSURE APPARATUS

This is a continuation application of Ser. No. 938,610 filed Dec. 5, 1986, now abandoned.

BACKGROUND OF THE INVENTION

1. Field of the Invention

The present invention relates to a projection exposure apparatus for manufacturing semiconductor elements and, more particularly, to an exposure apparatus of a system for correcting and controlling changes in imaging characteristics caused by changes in optical characteristics of exposure energy incident on a projection optical system.

2. Related Background Art

Matching precision is one of the most important factors in performance of a reduction or equal-size type projection exposure apparatus A factor greatly influencing the matching precision is magnification error of a projection optical system. The sizes of circuit patterns used for VLSIs have been decreased year by year, and line widths of micropatterns have also been subjected to miniaturization. Demand has arisen for improving matching precision. In order to satisfy such demand, it is necessary to keep projection magnification at a predetermined value. The magnification of a projection optical system is strictly adjusted when an apparatus incorporating such a system is manufactured and is installed in a production line. However, it is known that magnifications vary with respect to a predetermined magnification due to slight changes in temperature of the apparatus, slight barometric and temperature changes in a clean room, or emission of light incident on the projection optical system during the exposure. Under these circumstances, various conventional methods are proposed wherein errors caused by changes in magnification of the projection optical system are automatically corrected to maintain a predetermined magnification on a workpiece such as a wafer. Examples are a method of changing a distance between a reticle (or a mask) and a projection lens along the axial direction, a method of moving a specific element in a projection lens, and a method of controlling an air pressure in a specific air chamber in a projection lens to change a refractive index in this air chamber.

Among these conventional control methods, the last method has an advantage in that mechanically movable members are not used and a change in refractive index of air is utilized, thereby achieving magnification control with very high precision. Magnification control by such barometric control is disclosed in U.S. Ser. No. 632,335 filed on July 19, 1984, and the corresponding Japanese application.

According to a system described in this prior patent, a projection image (e.g., 15 mm square) of a pattern on a wafer can be fine-adjusted in the range of 0.02 μm±0.5 μm. So-called focal point changes also occur wherein a focal point (i.e., the position of the imaging plane) of the projection lens is changed along the axial direction. The focal point changes can also be corrected by barometric control.

Magnification and focal point changes caused by light incident on the projection lens, i.e., light passing through the reticle can be defined as storage of heat in the projection lens. In a normal projection lens, the wavelength components of the illumination light can be transmitted with high efficiency. However, some of the components are absorbed by the lens element or the like and are converted into heat.

Since heat storage of the projection lens is a heat diffusion phenomenon having a given time constant, the influences acting on optical characteristics such as the magnification and the focal point are the sum of influences of the previous incident light. By utilizing a given method, e.g., opening/closing operation of a shutter for emitting or shielding light to or from the reticle, history information of the incident light is produced, and barometric control is performed on the basis of the history information. In this manner, changes in optical characteristics caused by light incident on the projection lens during exposure can be sequentially corrected. Such an apparatus is described in detail in U.S. Ser. No. 656,777 filed on Oct. 1, 1984, now U.S. Pat. No. 4,666,273, issued May 19, 1987, and the corresponding Japanese application. According to this control method, history information of light incident on the projection lens is the most important factor. The history information is defined as data for solely specifying the changes in optical characteristics of the projection lens at present on the basis of the incident state of the previous light, and the like.

Since the history information represents a sum of influences of all previous light components, its loss for some reason (e.g., a power failure) during operation undesirably disables normal correction control of magnification. In addition, if errors occur in the history information, accurate control cannot be expected. In order to prevent this, a method is proposed wherein exposure is disabled from the time when the history information is lost or errors occur therein, for a short period of time for which influences of the history of the incident light can be neglected. After the projection lens is cooled, exposure under correction control in a state free from the influences of the history is restarted. However, it takes a long period of time to restore normal exposure processing. This control method is not suitable for high productivity. For example, when this method was used in a given test apparatus, it took 90 minutes or more (i.e., the apparatus down time) to cool the apparatus if safety time is included.

SUMMARY OF THE INVENTION

It is an object of the present invention to provide a projection exposure apparatus having a control system for correcting changes in imaging characteristics with high precision on a real-time basis.

It is another object of the present invention to provide a projection exposure apparatus having a control system for correcting imaging characteristics of a projecting lens on the basis of information associated with the history of light incident on the projection lens, wherein even if the history information of incident light is lost or an error occurs therein, correction control for the imaging characteristics can be restored with high precision.

The imaging characteristics corrected by the control system of the present invention include projection magnification, focal position, and curvature of field.

According to an aspect of the present invention, there is provided a projection exposure apparatus including: change detecting means for temporarily interrupting exposure processing when prediction information (or history information) capable of specifying changes in imaging characteristics and of being produced by a state of light incident on the projection optical system is lost (or an error occurs in its information), and for measuring and detecting changes in imaging characteristics of the projection optical system at a plurality of discrete points along a time base; calculating means for calculating accurate prediction information corresponding to the actual changes in imaging characteristics on the basis of a plurality of change values detected by the change detecting means; and restoring means for restoring change correction control on the basis of the accurate prediction information upon completion of calculation of the calculating means along the time base.

DESCRIPTION OF THE PREFERRED EMBODIMENTS

Figure 1:
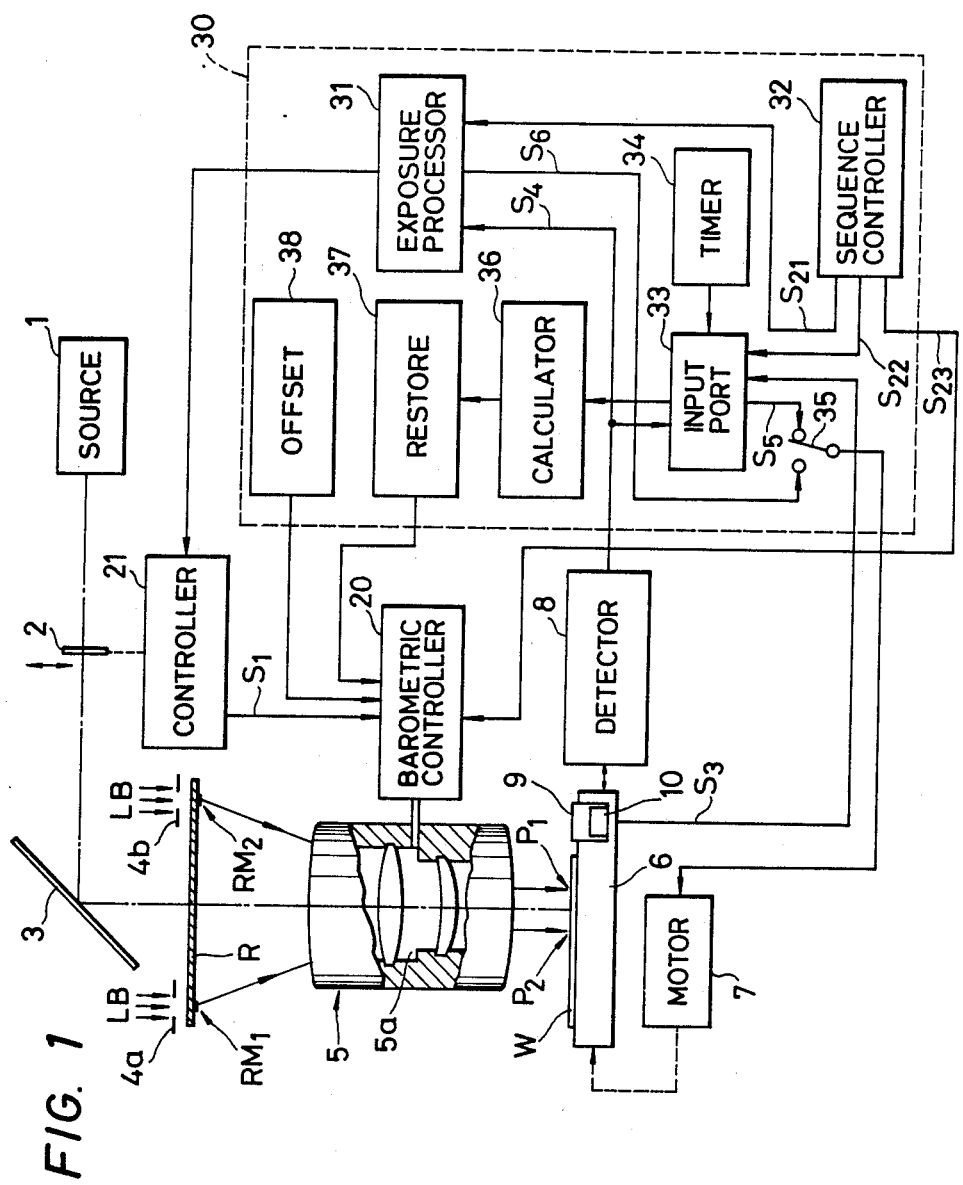
FIG. 1 is a diagram showing a projection exposure apparatus according to a first embodiment of the present invention.

FIG. 1 schematically shows a projection exposure apparatus according to a first embodiment of the present invention.

Illumination light from a light source 1 passes through a shutter 2 and is reflected by a mirror 3. The reflected light uniformly illuminates a reticle R having a circuit pattern and marks RM1 and RM2. The marks RM1 and RM2 are formed at two positions spaced apart from each other in a region around the circuit pattern of the reticle R. Light sources (not shown) are arranged to generate beams LB for independently illuminating only the marks RM1 and RM2, and stops 4a and 4b are arranged to define the illumination fields of view. Light passing through the circuit pattern and the marks RM1 and RM2 on the reticle R is incident on a projection lens 5. A circuit pattern image and a mark image are formed on a predetermined focusing surface. A stage 6 holds a wafer W thereon such that the level of wafer W is aligned with the level of the focusing surface. The stage 6 can be two-dimensionally moved in X and Y directions by a motor 7. The position of the stage 6 is detected by a detector 8 having a laser interferometer.

A slit plate 9 and a photoelectric detector 10 are arranged on the stage 6. The slit plate 9 has slits for transmitting a projection image P1 of the mark RM1 and a projection image P2 of the mark RM2. The beams passing through the slits are received by the photoelectric detector 10.

In this embodiment, a barometric controller 20 is arranged to correct changes in magnification of the projection lens 5. These changes are caused by illumination light incident on the projection lens 5. The barometric controller 20 controls pneumatic pressure in an air chamber 5a formed between two lens elements in the projection lens 5. The barometric controller 20 receives a signal S1 from a controller 21 for controlling opening/closing of the shutter 2. The signal S1 represents a duty ratio within a unit time (i.e., a sampling time) between the open and closed states of the shutter 2. The barometric controller 20 then produces prediction information for current magnification changes and controls the pressure or barometric value of the air chamber 5a on the basis of the prediction information.

The barometric controller 20 prestores data such as a time constant for the magnification change characteristics of the projection lens 5, a total amount of illumination light passing through the projection lens 5, and a magnification change value (i.e., a coefficient) as a function of a barometric control value. Based on these data signals and the spontaneously changing prediction information, the barometric controller 20 calculates the current magnification change value of the projection lens 5 and a barometric value for correcting such a change value, thereby controlling the pressure of the air chamber 5a. A detailed control method is described in the aforesaid patent No. 4,666,273.

In this embodiment, a correction control system 30 including a microcomputer or mini computer is used. In the correction control system 30, an exposure processor 31 performs exposure control of a step-and-repeat system and has the same arrangement as the conventional processor. In this sense, exposure processor 31 should not be included in the correction control system 30. However, for illustrative convenience, the arrangement in FIG. 1 is assumed. A sequence controller 32 supplies to the exposure processor 31 information S21 as to whether actual circuit pattern exposure is performed. The sequence controller 32 also supplies to the barometric controller 20 information S22 as to whether pressure control is continuously performed.

An input port 33 receives a photoelectric signal S3 from the photoelectric detector 10 and position information S4 from the detector 8 and detects the positional relationship between the mark images P1 and P2. The input port 33 sequentially stores the measured data corresponding to magnification change values. The stage 6 must be moved to detect the positions of the nark images P1 and P2. The input port 33 supplies drive information S5 to the motor 7 through a switch 35. The switch 35 supplies the drive information S6 from the exposure processor 31 to the motor 7 during exposure of the circuit pattern on the wafer W, thereby performing exposure of the step-and-repeat system. The input port 33 need not be started for every interval determined by a timer 34 but can be started at a timing so as to check whether the prediction information is lost or an error occurs in prediction information. The start timing is determined on the basis of information S23 from the sequence controller 32.

A calculator 36 for restoring or correcting the prediction information performs restoration of the lost prediction information or correction of the prediction information to accurate information according to a curve fitting scheme or the like. A restore section 37 sends the restored or corrected prediction information (the accurately corrected prediction information) to the barometric controller 20 and at the same time instructs the restart of barometric control on the basis of the accurate prediction information or the shift to accurate barometric control at a predetermined timing.

An offset setting section 38 serves as an input section for allowing an operator to add a predetermine offset value to a magnification. When an offset value is input, the input data is sent to the barometric controller 20 so that predetermined barometric offset always acts in barometric control.

The interior of the control system 30 having the arrangement described above is divided into functional blocks for realizing the functions of the present invention. However, in practice, these functions are realized by software.

Now that the schematic arrangement of this embodiment has been described, a case will be described wherein the prediction information is lost, and then a case will be described wherein the prediction information is corrected.

Figure 2:
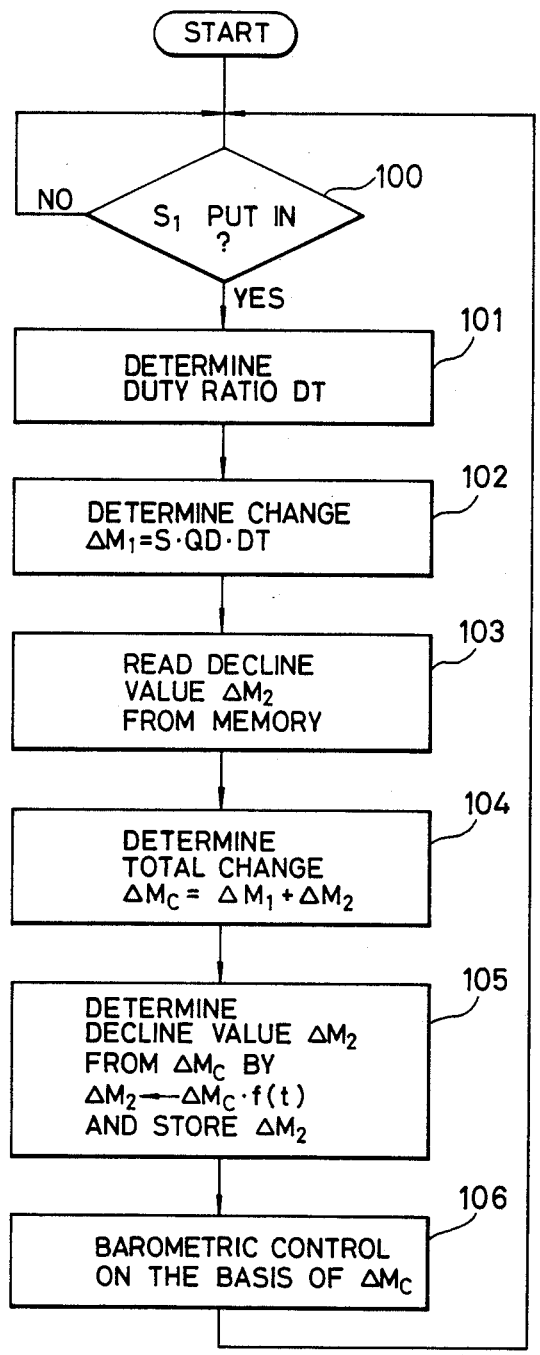
FIG. 2 is a flow chart of control operation for correcting changes in magnification.

The operation of the barometric controller 20 will be briefly described with reference to a flow chart in FIG. 2 and a timing chart of FIG. 3. The general operation of the control method in this flow chart is described in the aforesaid patent No. 4,666,273. Assume that a total amount of light incident on the projection lens 5 through the reticle R is measured and stored as a value QD.

The system 30 determines in step 100 whether the information S1 from the shutter controller 21 is present. If YES in step 100, a duty ratio DT is determined in step 101. The duty ratio is a ratio of a total time Tu for opening the shutter 2 to a total time Td for closing the shutter 2 in time intervals (e.g., 10 seconds) defined by times t1, t2, ... t12, ... along the time base, as shown in FIG. 3. A unit time t0 is defined so that relation TO=Tu+Td is established. The duty ratio DT is determined as follows:

DT=Tu/TO=Tu/(Tu+Td)

As is apparent from the above equation, if the shutter 2 is kept open during the unit time TO, Tu=TO and Td=0. In this case, the duty ratio is 1 (100%).

Figure 3:
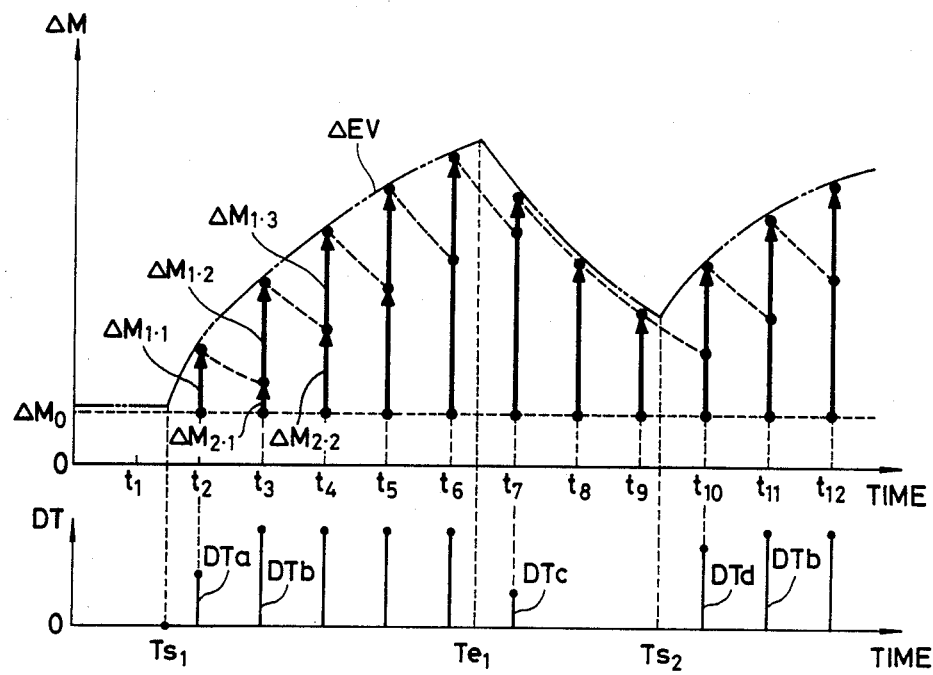
FIG. 3 is a graph for explaining correction control.

The abscissa in FIG. 3 denotes time t, the ordinate in the upper chart denotes a change value $\Delta M$, and the ordinate in the lower chart denotes the duty ratio DT (for $0 \leq DT \leq 1$). At time Ts1, the step-and-repeat exposure is started for the first wafer. At time Te1, exposure of the first wafer is completed. At time Ts2, exposure of the second wafer is started. The change value $\Delta M0$ is a predetermined offset value. The change value of the magnification (or a focal point) caused by illumination light incident on the projection lens 5 is defined as a reference value.

The change value $\Delta M$ in FIG. 3 represents prediction characteristics for every unit time estimated on the basis of the incident state and is not the actual change value of the optical characteristics of the projection lens 5. The actual change value in a state wherein correction under barometric control is not performed is represented by a real characteristic curve EV indicated by the alternate long and two short dashed line.

Referring back to the flow chart, when the duty ratio DT is determined, the change value $\Delta M1$ corresponding to the accumulated energy of illumination light incident within the unit time is determined. In this case, the total light amount value QD and a proportional constant S prepared by experiments or the like are used to perform a calculation as follows:

$$M1 = S \cdot QD \cdot DT \quad (1)$$

Referring to FIG. 3, the exposure start time Ts1 of the first wafer is present between times t1 and t2. The duty ratio DT within the unit time between the times t1 and t2 is detected as DTa at time t2. The value DTa is used as a prediction value at time t2, so that the change value $\Delta M1.1$ is calculated according to equation (1).

In step 103, a decline value $\Delta M2$ after the lapse of the unit time with respect to the change value at time t1 is read out from a memory at the end of the previous unit time. If the prediction value at time t1 in FIG. 3 is zero, its $\Delta M2$ value is zero. Data of zero is then stored in the memory. In step 104, a total change value $\Delta Mc$ is calculated as follows:

$$\Delta Mc = \Delta M1 + \Delta M2 \quad (2)$$

For example, since $\Delta M2=0$ at time t2, then $\Delta Mc = \Delta M1$. In step 105, the decline value of the $\Delta Mc$ after the lapse of the unit time is calculated to be $\Delta M2$, and the calculated value is stored in the memory. This calculation is performed according to equation (4) by using a decline function f(t) obtained by experiments or the like in equation (3):

$$f(t) = \sum_{n=1}^{k} An \cdot e^{-t/Tn} \quad (3)$$

$$\Delta M2 = \Delta Mc \cdot f(t) \quad (4)$$

For example, if the change value $\Delta Mc$ at time t2 is given to be $\Delta M1.1$, $\Delta M1.1$ declines to $\Delta M2.1$ at time t3 according to equation (4).

In step 106, only the change caused by illumination light incident on the projection lens 5 is corrected by barometric control on the basis of the change value $\Delta Mc$ calculated at time t2. The same operations as described above are then repeated from step 100.

Within the unit times between times t2 and t3, times t3 and t4, and times t5 and t6, exposure shots on the wafer are repeated at regular time intervals. In this sense, the duty ratios DT within the respective unit times are substantially identical, i.e., a predetermined value DTb. For this reason, the change value $\Delta Mc$ determined at time t3 is $\Delta M2.1 + \Delta M1.2$ (for $\Delta M1.2 = S \cdot QD \cdot DTb$). The change value $\Delta Mc$ determined at time t4 is $\Delta M2.2 + \Delta M1.3$ (for $\Delta M2.2 = (\Delta M2.1 + \Delta M1.2).f(t)$, and $\Delta M1.3 \approx \Delta M1.2$). In this manner the change values (prediction values) $\Delta Mc$ are sequentially updated. When the $\Delta Mc$ values at times t1, t2, t3, ... are plotted to obtain an envelope, the envelope substantially matches with the real characteristic curve EV.

The duty ratio DTc detected at time t7 is a ratio DTc smaller than the ratio DTb since time Te1 falls within the duration between times t6 and t7. The duty ratio DT between times t8 and t9 is zero since no exposure is performed. No new light is incident between times t8 and t9, and the change value $\Delta Mc$ at time t9 is determined as a monotonous decline value from the previous change value $\Delta Mc$. In addition, exposure of the second wafer is performed in the manner as described above. More specifically, a new change value ($\Delta M1 = S \cdot QD \cdot DTd$) based on a duty ratio DTd at time t10 is added to the offset value $\Delta M0$.

The proportional constant S is a given value since the reflectance of the wafer is predetermined. The value QD is also predetermined unless the currently used reticle is replaced with another reticle or the intensity of the illumination light is changed when the shutter 2 is opened.

The normal operation of the barometric controller 20 has been described above. The value ΔM2 or ΔMc is prediction information (i.e., the prediction value) corresponding to changes in imaging characteristics.

An operation will be described wherein barometric control is restored when the prediction value is lost, e.g., the operation is immediately restored after a power failure, or the operation is immediately restored after the apparatus (the barometric controller or the like) overruns due to its failure and is temporarily reset. For the sake of simplicity, assume that the atmospheric pressure and temperature at the projection lens 5 are kept unchanged. An actual change value ΔY(t) of the projection lens 5 during change correction control is expressed as follows:

$$\Delta Y(t) = Ce \int_{-\infty}^{t} \alpha(t - \tau) \cdot E(\tau) d\tau + \Delta Yof(t) + \Delta Ycnt(t) \tag{5}$$

where Ce is the coefficient (corresponding to the constant S) of characteristic changes caused by illumination light incident on the projection lens 5, E(τ) is the amount of light incident on the projection lens 5 at time t=τ, α(t−τ) is the ratio of the residual amount of E(τ) to E(τ) at time t, ΔYof(t) is the offset value, and ΔYcnt(t) is the control value for change correction.

The function α(t) is expressed as follows if k different time constants are given as T1, T2, ... Tk:

$$\alpha(t) = \sum_{n=1}^{k} An \cdot e^{-t/Ta} \tag{6}$$

Equation (6) represents the decline characteristic curve defined in equation (3).

In the normal state, the correction control value ΔYcnt(t) is given in equation (7) below:

$$\Delta Ycnt(t) = -Ce \int_{-\infty}^{t} \alpha(t - \tau) \cdot E(\tau) d\tau - \Delta Yof(t) \tag{7}$$

A substitution of equation (7) into equation (5) yields that the value ΔY(t) is zero. Therefore, in the normal state, the magnification and focal point are accurately controlled, and no changes therein occur.

Figure 4:
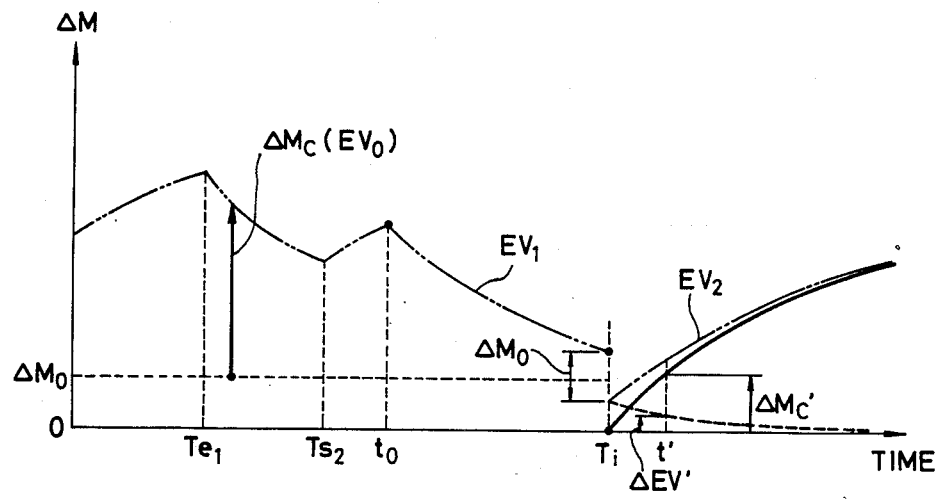
FIG. 4 is a graph for explaining changes in magnification at the time of a power failure.

Assume that the prediction value and the offset information are lost at time t0. Also assume that a new prediction value is produced at time t' after time t0. The power failure is restored at time Ti prior to time t' but after time t0, and the controlled state of the apparatus is restored to be the initial state. The new prediction value is produced from zero at time Ti on the basis of the duty ratio DT. When exposure is restarted from time Ti, the change characteristic curve is changed, as shown in FIG. 4. Time is plotted along the abscissa in FIG. 4, and the change value ΔM is plotted along the ordinate. A pressure at the time of error occurrence (t0) is maintained until time Ti, and the offset value is also lost at time t0.

Exposure of the first wafer is completed at time Te1, exposure of the second wafer is started at time Ts2, and the power failure occurs at time t0 immediately after the initiation of exposure of the second wafer. Until time t0, a real characteristic curve (characteristics without barometric control) EV0 of changes in magnification of the projection lens 5 caused by illumination light incident thereon is substantially accurately corrected on the basis of the accurate prediction value ΔMc calculated by using the duty ratio DT. The projection image on the wafer is controlled such that the absolute size continuously corresponds to the offset value ΔM0.

However, after time t0, a real characteristic curve EV1 of changes in magnification of the projection lens 5 is monotonously declined according to the function represented by equation (3) or (6). When the apparatus restores the previous state at time Ti, the change value on the basis of the real characteristic curve EV1 is still present. When exposure is restarted from time Ti, the new prediction value produced at time t' is given as ΔMc' while time Ti is given as zero.

However, the real characteristic curve EV1 of the projection lens 5 is inclined from the remaining region of time Ti and is changed to a real characteristic curve EV2. It should be noted that the pressure held at time Ti is reset to the standard atmospheric pressure, i.e., 760 mmHg. Although the prediction value at time t' is ΔMc', the value of the real characteristic curve EV2 is larger by a residual value ΔEV' than the prediction value ΔMc'. The one-to-one correspondence is not established at this time. If the offset value is simultaneously set to be zero, the magnification error on the wafer is ΔEV'+ΔM0. Since the value ΔEV' is reduced (or declined) to zero as a function of time, the value ΔMc' is eventually matched with the real characteristic curve EV2. If an incomplete correction control value (ΔMc') at time t after time Ti (or t0) is given as ΔYcht'(t), it is given as follows:

$$\Delta Ycnt'(t) = -Ce \int_{t_o}^{t} \alpha(t - \tau)E(\tau)d\tau \tag{8}$$

Substitutions of ΔYcnt'(t) in equation (8) into ΔYont(t) in equation (5) and equation (6) thereinto yield equation (9) as follows:

$$\Delta Y(t) = \sum_{n=1}^{k} Bn \cdot e^{-(t-t_0)/T_n} + \Delta Yof(t) \tag{9}$$

for Bn is given by equation (10) below:

$$Bn = Ce \cdot An \int_{-\infty}^{t_o} e^{-(t_o-\tau)/T_a} \cdot E(\tau)d\tau \tag{10}$$

If the prediction value produced by all previous illumination light incident on the projection lens 5 is lost at time t0, the changes in magnification (errors of the magnification required on the wafer) of the projection lens 5 under correction control (i.e., barometric control from time Ti) follow the characteristics given by equation (9). Therefore, the changes in the magnification are given as a sum of the values ΔEV' and ΔYof(t) in FIG. 4. In equation (9), if the unknown parameters Bn (n=1, 2, ... k) and the value ΔYof(t) are determined, barometric control with high precision can be restored.

The most effective technique for determining the unknown parameters is the method of least squares. The unknown parameters in equation (9) will be determined by using the method of least squares. The number of parameters to be determined is (k+1). Change values $\Delta Y(tj)$ on the real characteristic curve EV2 given by equation (9) at m moments after time Ti in FIG. 4 are actually measured, where m is given as $m \geq k+1$ and $j=1, 2, \ldots m$. Change values at m discrete moments along the time base are measured as $\Delta Y(t1), \Delta Y(t2), \ldots \Delta Y(tm)$.

A function G1(n) is defined by equation (11) where $n=1, 2, \ldots k$, and a function G2(a,b) is defined by equation (12) where each of a and b is independently 1, 2, $\ldots$ k:

$$G_1(n) = \sum_{j=1}^{m} e^{-(tj-to)/Tn} \quad (11)$$

$$G_2(a,b) = \sum_{j=1}^{m} e^{-(tj-to)/Ta} \cdot e^{-(tj-to)/Tb} \quad (12)$$

By using the functions G1(n) and G2(a,b), the parameters Bn ($n=1, 2, \ldots k$) and the value $\Delta Yof(t)$ (assuming the constant value $\Delta Yof$) are calculated by equation (13) below:

$$\begin{bmatrix} B_1 \\ B_2 \\ \cdot \\ \cdot \\ B_k \\ \Delta Yof \end{bmatrix} = \begin{bmatrix} G_2(1,1) & \cdot & G_2(1,2) & \ldots & G_2(1,k) & \cdot & G_1(1) \\ G_2(2,1) & \cdot & G_2(2,2) & & G_2(2,k) & \cdot & G_1(2) \\ \cdot & & \cdot & & & & \cdot \\ \cdot & & & \ddots & & & \cdot \\ \cdot & & & & & & \cdot \\ G_2(k,1) & \cdot & G_2(k,2) & & G_2(k,k) & \cdot & G_1(k) \\ G_1(1) & \cdot & G_1(2) & \ldots & G_1(k) & \cdot & m \end{bmatrix}^{-1} \times \begin{bmatrix} \sum_{j=1}^{m} \Delta Y(tj) \cdot e^{-(tj-to)/T1} \\ \sum_{j=1}^{m} \Delta Y(tj) \cdot e^{-(tj-to)/T2} \\ \cdot \\ \cdot \\ \sum_{j=1}^{m} \Delta Y(tj) \cdot e^{-(tj-to)/Tk} \\ \sum_{j=1}^{m} \Delta Y(tj) \end{bmatrix} \quad (13)$$

The number of sufficient time constants for approximating the decline characteristics is four. If k=4 is established, equation (13) is a 5×5 matrix. In this sense, the unknown parameters Bn and the value $\Delta Yof(t)$ can be calculated without requiring a considerably large amount of calculations.

Equations (13) presumes that j data values $\Delta Y(tj)$ have identical errors. However, if data values have different errors $\sigma(tj)$, the following function is derived, and the parameters are calculated according to equation (17):

$$G_1'(n) = \sum_{j=1}^{m} \left( \frac{e^{-(tj-to)/Tn}}{\sigma^2(tj)} \right) \quad (14)$$

$$G_2'(a,b) = \sum_{j=1}^{m} \left( \frac{e^{-(tj-to)/Ta} \cdot e^{-(tj-to)/Tb}}{\sigma^2(tj)} \right) \quad (15)$$

$$G_3'(n) = \sum_{j=1}^{m} \left( \frac{\Delta Y(tj) \cdot e^{-(tj-to)/Tn}}{\sigma^2(tj)} \right) \quad (16)$$

(where each of n, a and b is independently 1,2, $\ldots$ k)

$$\begin{bmatrix} B_1 \\ B_2 \\ \cdot \\ \cdot \\ B_k \\ \Delta Yof \end{bmatrix} = \begin{bmatrix} G_2'(1,1), G_2'(1,2) & \ldots & G_2'(1,k), & G_1'(1) \\ G_2'(2,1), G_2'(2,2) & & G_2'(2,k), & G_1'(2) \\ \cdot & & \cdot & \cdot \\ \cdot & \ddots & & \cdot \\ G_2'(k,1), G_2'(k,2) & & G_2'(k,k), & G_1'(k) \\ G_1'(1), G_1'(2) & \ldots & G_1'(k), & \sum_{j=1}^{m} \{1/\sigma^2(tj)\} \end{bmatrix}^{-1} \times \begin{bmatrix} G_3'(1) \\ G_3'(2) \\ \cdot \\ \cdot \\ G_3'(k) \\ \sum_{j=1}^{m} \left( \frac{\Delta Y(tj)}{\sigma^2(tj)} \right) \end{bmatrix} \quad (17)$$

The simplest method of restoring barometric control with high precision by using the resultant parameters B1, B2, $\ldots$ Bk and the value $\Delta Yof$ is given as follows. A substitution of equation (6) into equation (8) yields equation (18) below:

$$\Delta Ycnt'(t) = -Ce \sum_{n=1}^{k} An \int_{t0}^{t} e^{-(t-\tau)/Tn} \cdot E(\tau) d\tau \quad (18)$$

In equation (18), $$An \cdot E(Tr) => An \cdot E(Tr) + \quad (19)$$

$$\{(1/Ce)Bn \cdot e^{-(\tau-t0)/Tn}\} \cdot \sigma(\tau - Tr)$$

Where $n=1, 2, \ldots k$, and $\sigma(\tau-Tr)$ is the delta function.

The above substitution is performed at predetermined restoration time Tr to correct the value $\Delta Ycnt'(t)$ in equation (18) to the accurate prediction value. At the same time, the offset value $\Delta Yof$ calculated by equation (13) or (17) is subtracted from the value $\Delta Ycnt'(t)$, accurate barometric control is restored from time Tr.

The value calculated by equation (18) is a new prediction value produced from time t0 (or Ti). In the state represented by equation (18), the value ΔY'cnt(t) still corresponds to the value ΔMc', as shown in FIG. 4.

If the value ΔY'cnt(Tr) obtained by performing substitution (19) into equation (18) is the accurate prediction value at time Tr, barometric control can be restored and can continue. In this case, since the offset value ΔYof is also reproduced, the size of the image on the wafer can be restored as the one prior to the system down.

The above description is concerned with the case wherein the offset value ΔYof of the magnification is also lost. However, if the offset value is stored in a floppy disk or the like, the unknown parameters calculated by equation (13) or (17) are only Bn (where n=1, 2, ... k). In this case, only k magnification change data ΔY(tj) (where j=1, 2, ... k) are measured.

Figure 5:
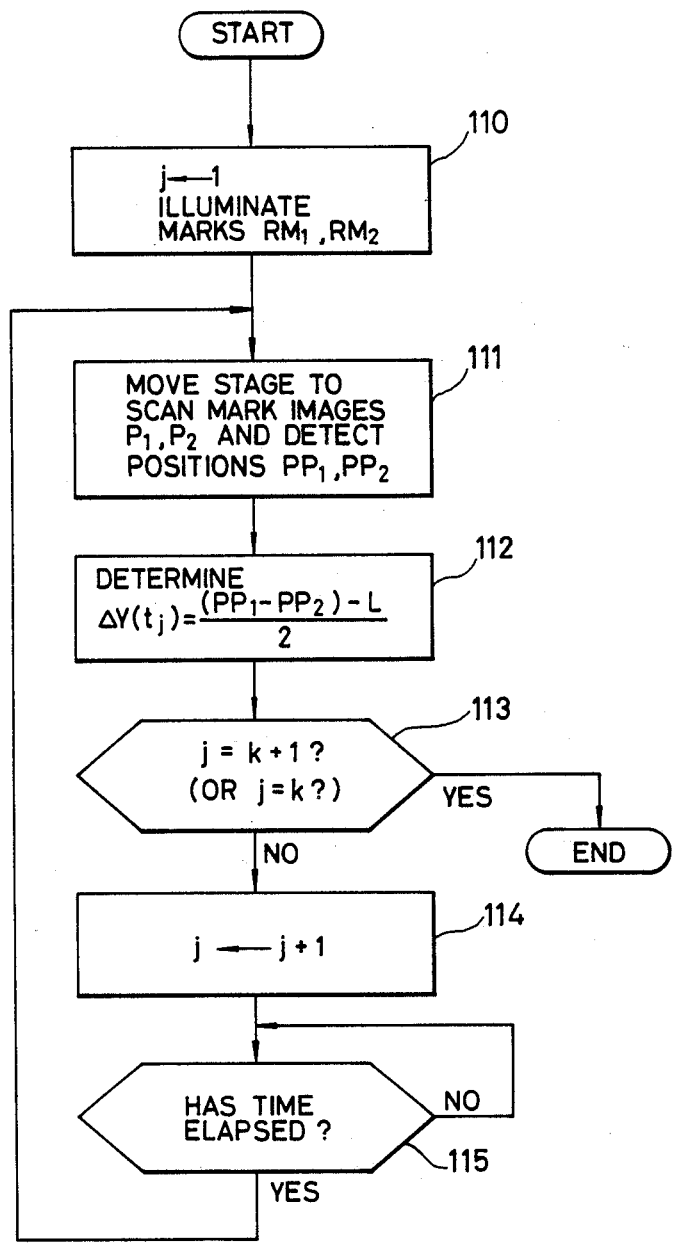
FIG. 5 is a flow chart for automatically measuring change values in magnification.

The calculation of the magnification change data ΔY(tj) will be described with reference to a flow chart in FIG. 5. FIG. 5 is a flow chart for explaining the operation of the input port 33 in FIG. 1. When the operation of the control system 30 is restored after a power failure or the operation is restored after a control error occurs and the apparatus is reset, the sequence controller 32 outputs a signal S23. In response to this signal, step 110 in FIG. 5 is executed. The variable j is set to be 1. The switch 35 is set in the state shown in FIG. 1. The shutter 2 is kept closed. Only the marks RM1 and RM2 are irradiated with illumination light LB.

In step 111, the stage 6 is moved to scan the mark images P1 and P2 by the slits in the slit plate 9. At the same time, the signal S3 and the position information S4 are input to the input port 33. A position PP1 of the mark image P1 and a position PP2 of the mark image P2 are calculated by high-speed processing.

Figure 6:
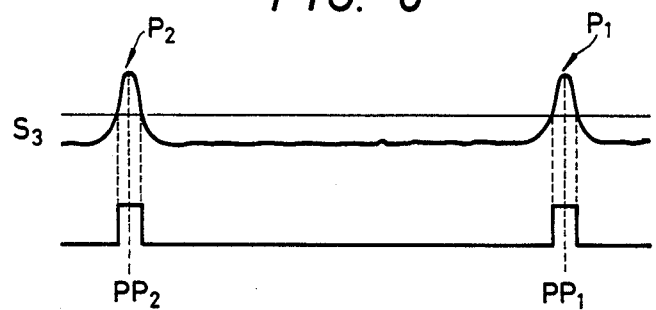
FIG. 6 is a timing chart showing signal waveforms in signal processing when manufacturing change values are to be detected.

The positions PP1 and PP2 are calculated, as shown in FIG. 6. The scanning position is plotted along the abscissa in FIG. 6. The waveform of the signal S3 from the photodetector 10 is digitized, and the resultant binary data is assigned to the position information S4 from the detector 8. The central points between the pair of leading edges and between the pair of trailing edges of the binary data are respectively defined as the position PP1 and PP2. The calculation of the positions PP1 and PP2 is not limited to the one described above. The time for executing step 111 is stored in the data input port 33.

The change data ΔY(tj) is calculated on the basis of the positions PP1 and PP2 measured in step 112. The mark images P1 and P2 are symmetrical about the center of shot. If a designed distance between the mark images P1 and P2 is given as L, the data ΔY(tj) is calculated as follows:

$$\Delta Y(tj) = \{(PP1 - PP2) - L\}/2 \quad (20)$$

This value can be calculated with precision (e.g., 0.01 μm) corresponding to ½ of the resolution of the detector 8.

The system 30 determines in step 113 whether the variable j reaches (k+1) or k. If YES in step 113, the data fetching sequence is completed.

However, if NO in step 113, the variable j is incremented by one in step 114, and the flow advances to step 115. In step 115, the system 30 checks a flag sent from the timer 34 every time a predetermined period of time has elapsed. Until the flag is set, the operation is kept interrupted. When the predetermined period of time has elapsed, the operations from step 111 are repeated. The predetermined period of time set in the timer 34 may be a predetermined duration (e.g., 10 seconds). However, unless exposure is performed, the real characteristic curve of changes declines, so that the time interval may be accordingly prolonged.

For example, if a time interval between the measuring time for j=1 and that for j=2 is set to be 5 seconds, the time interval between the measuring times for j=2 and j=3 is set to be 10 seconds. The time intervals are sequentially increased in an order of 20 seconds, 40 seconds, 80 seconds, ..., to achieve better measurement precision. In this case, the time intervals need not be strict.

Figure 7A:
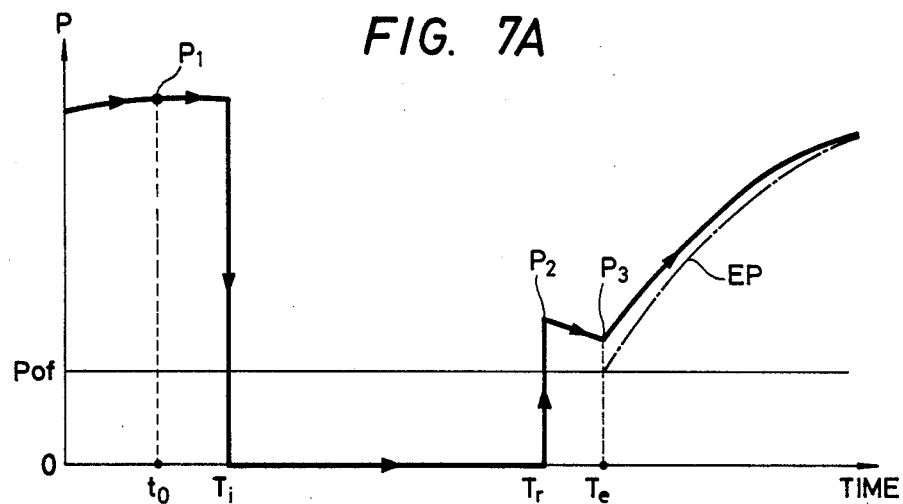
FIGS. 7A and 7B are respectively graphs showing the barometric and magnification changes.
Figure 7B:
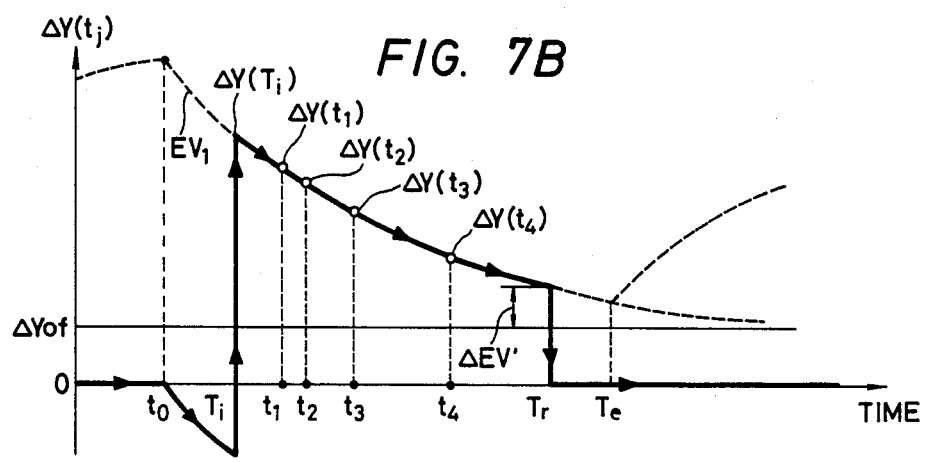

The resultant data ΔY(tj) is plotted in graphs of FIGS. 7A and 7B. FIG. 7A represents barometric control values P as the prediction values, and FIG. 7B represents the magnification change values ΔY(tj) on the surface of the wafer. In the respective characteristics, even if the barometric value P is set to be zero (controlled on the basis of the standard atmospheric pressure, i.e., 760 mmHg), the magnification offset value of +ΔYof from the zero magnification error on the wafer is presumed. A barometric offset value of +Pof is added in order to set the magnification offset value of ΔYof to be zero. In other words, the projection lens itself is used with an offset of −ΔYof corresponding to +Pof. As shown in FIG. 7A, accurate barometric control is performed on the basis of the accurate prediction value until time t0 when a power failure Occurs. However, from time t0, the barometric controller 20 is designed (normally closed type) to close an electromagnetic valve or the like connected to the air gap 5a.

The magnification value on the wafer is controlled to be zero until time t0. If the barometric value at time t0 is given as P1, the barometric value is kept unchanged until time Ti for initializing the system when the operation is restored after the power failure. For the duration between the times t0 and t1, exposure light does not pass through the projection lens. As shown in FIG. 7B, the magnification error of the projection lens itself is reduced by the thermal diffusion phenomenon according to the decline characteristic curve EV1. For this reason, the magnification change value on the wafer is changed toward the negative direction from zero. When the system is energized at time Ti, the barometric controller 20 releases the pressure from the air chamber 5a and provides the standard atmospheric pressure (760 mmHg). For this reason, the barometric value P1 is reduced to zero at time Ti, as shown in FIG. 7A. As shown in FIG. 7A, the barometric value is abruptly reduced to zero at time Ti. However, in practice, the value is reduced to zero during a predetermined period of time so as to prevent the lens element in the projection lens from receiving an abrupt change in stress.

When the pressure is changed from P1 to zero at time Ti, the value of change in magnification on the wafer is increased to +ΔY(Ti), as shown in FIG. 7B. The change value from this moment includes the steady magnification offset component ΔYof. A new prediction value for barometric control is produced from time Ti on the basis of the duty ratio DT of the opening/closing of the shutter 2. In this embodiment, while the actual value of the magnification change is measured, the shutter 2 is not opened. Therefore, data of DT=0 is sequentially obtained for every unit time (e.g., 10 seconds).

The apparatus itself starts counting time from time Ti at the time when the system is energized. The apparatus receives four data values ΔY(t1), ΔY(t2), ΔY(t3), and ΔY(t4) at times t1, t2, t3 and t4, respectively. Meanwhile, the barometric controller 20 performs barometric control on the basis of data of DT=0. As long as DT=0 continues, the actual barometric value P is kept zero (i.e., 760 mmHg). The characteristics determined by data values ΔY(t1), ... ΔY(t4) are measured as a sum of the value represented by the decline characteristic curve EV1 of the projection lens itself and the offset value ΔYof. After the last data value ΔY(t4) is fetched, the calculator 36 in FIG. 1 performs the calculation according to equation (13) or (17). The calculator 36 then performs the substitution operation according to substitution (19) at the predetermined restoration time Tr.

According to the calculations described above, the offset value ΔYof at time Tr and the change value ΔEV' of the characteristic curve EV1 in the time region after time t0 are reproduced. When substitution (19) is performed at time Tr, the restore section 37 designates to the barometric controller 20 a sum P2 of the barometric offset value Pof corresponding to the magnification offset value ΔYof and the barometric value corresponding to ΔEV'. Therefore, the magnification change value of the wafer is corrected to be zero again. The barometric controller 20 retains the prediction value as the accurate prediction value for providing a barometric value corresponding to ΔEV' at time Tr.

If exposure is started after time Te, the duty ratio DP is not zero any longer. The barometric value P is increased from P3 again from time Te, thereby correcting that the magnification error on the wafer is always zero.

A characteristic curve EP representing a value increased from the offset value Pof at time Te is a barometric control characteristic curve when a remaining portion of the magnification change value caused by the light incident on the projection lens after time t0 is zero at time Te. In the above description, the time Tr can be arbitrarily set. However, it is preferable to shorten the time by predicting the calculation period (e.g., several seconds) until substitution (19) can be initiated after time t4 and by predicting a moment upon the lapse of the calculation period. In order to correspond substitution (19) with the graphs in FIGS. 7A and 7B, time t0 corresponds to time Ti.

The relationship between times Tr and Te may be reversed. In this case, however, inaccurate barometric control is performed for a period between times Te and Tr.

In the above embodiment, even if the prediction information (i.e., the prediction value) is completely lost, accurate barometric control can be restored when a calculation time for the magnification change data ΔY(tj) has elapsed. While the ΔY(tj) values are calculated, the barometric value P is set to be zero (760 mmHg) in FIG. 7A. However, the barometric value may be kept at a predetermined value, e.g., P1 until time Tr. In this case, a new prediction value from time Ti must be prepared.

An operation will be described wherein an error occurs in the prediction value. This operation is substantially the same as the case wherein the prediction value is lost. It is difficult to discriminate the case wherein the prediction value is lost from the case wherein the error occurs in the prediction value. It is natural that such an error be normally detected at the time when the resist pattern of the wafer is inspected. Even in this case, exposure of the circuit pattern on the wafer is interrupted, the magnification change data ΔY(tj) is actually measured, and the currently used prediction value is replaced with the accurate prediction value More specifically, if the term E(τ) in the right-hand side of equation (10) is a difference between the accurate amount of incident light and the actual but wrong amount of incident light, equations (13) and (17) and substitution (19) are established without modifications. However, if t>t0 (after time T1), then the accurate prediction value is obtained on the basis of the previous incident state (the duty ratio of the shutter).

Figure 8:
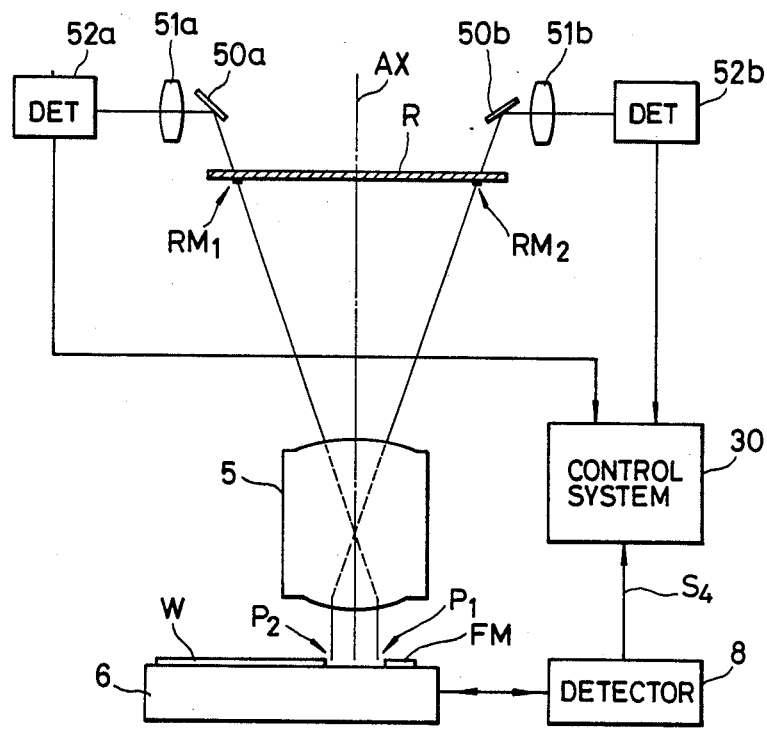
FIG. 8 is a diagram showing a projection exposure apparatus according to a second embodiment of the present invention.

FIG. 8 shows an exposure apparatus according to a second embodiment of the present invention. The apparatus of the second embodiment is different from that of the first embodiment in that a self illumination type TTL (Through-The-Lens) alignment system is used as a change detecting means.

In the second embodiment, the TTL alignment system comprises mirrors 50a and 50b respectively arranged above marks RM1 and RM2 of a reticle R, objective optical systems 51a and 51b, and photoelectric detectors 52a and 52b including television cameras and illumination systems. The TTL alignment system detects the overlapping state between the mark RM1 or RM2 and a reference mark FM formed on a stage 6. Procedures for measuring the magnification change are performed as follows. The stage 6 is positioned such that the reference mark FM is aligned with the mark RM1 (or is located in a given positional relationship with the mark RM1) by the alignment system (50a, 51a and 52a). An alignment position PP1 is detected by a detector 8 and is stored in a memory. Thereafter, the stage 6 is positioned such that the reference mark FM is aligned with the mark RM2 by the alignment system (50b, 51b and 52b). An alignment position PP2 is detected in the same manner as described above. The subsequent calculations are the same as those in the above embodiment.

Figure 9:
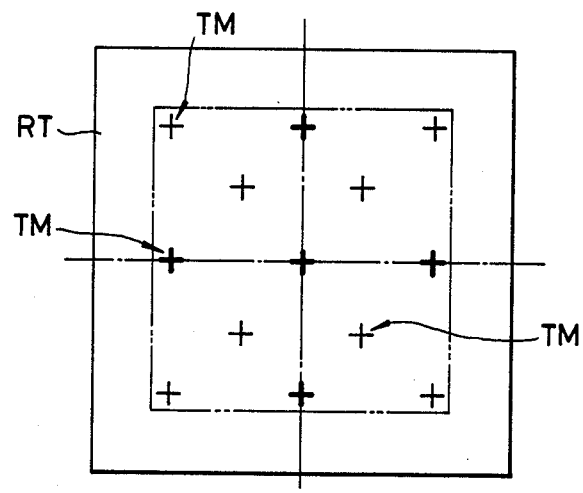
FIG. 9 is a plan view of a test reticle suitable for a third embodiment of the present invention.

A third embodiment of the present invention will be described below. The third embodiment differs from the first and second embodiments in that a shutter 2 is opened to emit exposure light onto a projection lens 5 while magnification change data ΔY(tj) is measured. Assume that a test reticle RT in FIG. 9 is mounted in place of the original reticle at the time of energization of the system after, e.g., a power failure. Test marks TM are formed at predetermined different positions on the test reticle RT. In order to measure the actual values of magnification changes, projection positions of the marks TM are detected by using a slit plate 9 (FIG. 1) and a photoelectric sensor 10 (FIG. 1), while an image of the test reticle RT is kept projected.

Figure 10A:
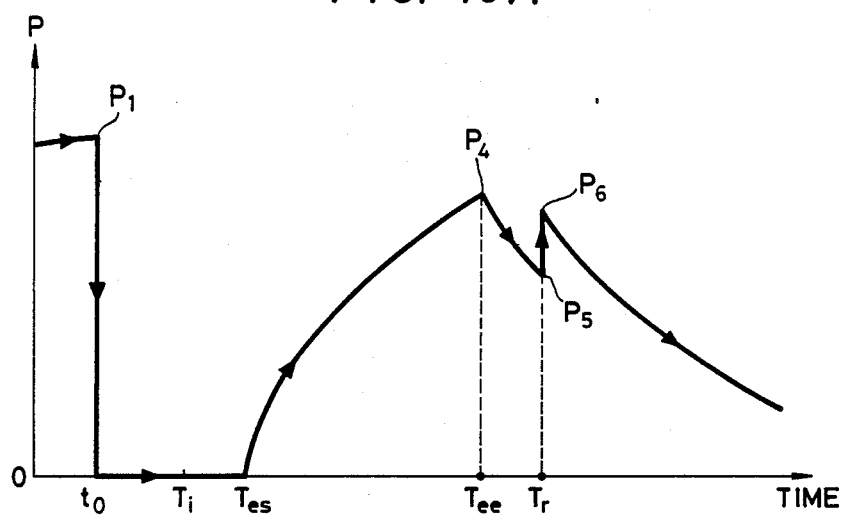
FIGS. 10A and 10B are respectively graphs showing the barometric and magnification changes in restoration operation.
Figure 10B:
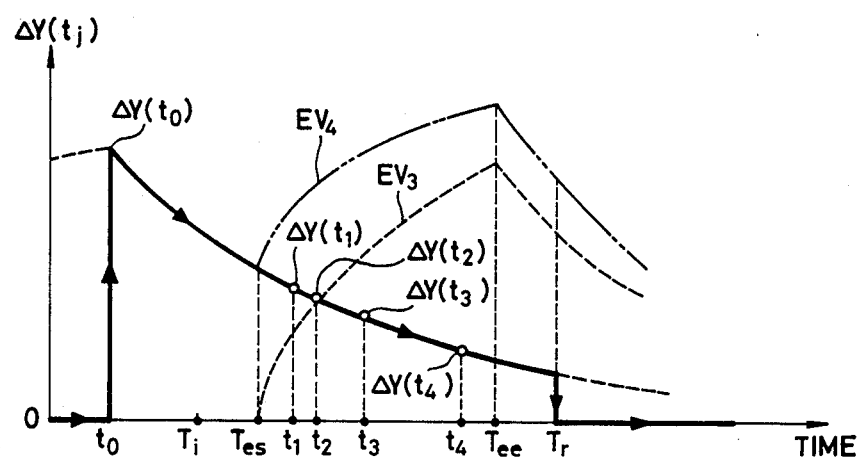

In this case, at least two images of the test marks TM must be detected to obtain one data ΔY(tj). However, in order to improve measurement precision, a larger number of test marks TM can be detected. It should be noted the detection must be performed for a very short period of time. The relationships between the prediction values (barometric control values) and the actual change characteristics are plotted in the graphs of FIGS. 10A and 10B. FIG. 10A show barometric values P as the prediction values, and FIG. 10B shows magnification change values ΔY(tj) of the wafer. Times t0, Ti, t1, t2, t3, t4 and Tr are defined in the same manner as in FIGS. 7A and 7B. However, a barometric controller 20 in the third embodiment is designed such that the pressure within the projection lens 5 is released to the standard atmospheric pressure when a power failure occurs.

For the sake of simplicity, both the magnification offset and the pressure offset are set to be zero.

If the pressure P1 at time t0 is reduced to zero (760 mmHg), the magnification change value $\Delta Y(tj)$ of the wafer is increased from zero to $\Delta Y(t0)$. When the system is energized at time Ti, the test reticle RT shown in FIG. 9 is loaded. In this case, the new prediction value on the basis of the duty ratio DT has produced from time Ti. The shutter 2 is opened at time Tes after loading of the test reticle RT. For this reason, the duty ratio DT sampled after time Tes is set to be 1 (100%). An incline characteristic curve EV3 after time Tes in FIG. 10B represents magnification changes of the projection lens itself in a state wherein, the magnification change value $\Delta Y(tj)$ has already been set to zero at time Tes. A characteristic curve EV4 inclining from time Tes represents magnification change values of the wafer when barometric control is not performed on the basis of the new prediction value. In this embodiment, as shown in FIG. 10A, barometric control is started from time Tes, and the barometric value is increased from zero (e.g., 760 mmHg). In this case, the change value to be corrected under this barometric control is the EV3 component.

The magnification change values of the wafer are changed in an order of $\Delta Y(t1)$, $\Delta Y(t2)$, $\Delta Y(t3)$ and $\Delta Y(t4)$. In other words, if barometric control is performed on the basis of the new prediction value after energization of the system, the characteristic curve monotonously declining from the magnification change value $\Delta Y(t0)$ at the time of the power failure can be obtained.

Since the shutter 2 is closed at time Tee, the barometric value reaches a barometric value P4 and is gradually decreased. The restoration operation is performed at time Tr. The change value on the characteristic curve EV4 at time Tr is reproduced as the correct prediction value, and a corresponding barometric value P6 is set. At the time when the barometric value P6 is set, the magnification error of the wafer is corrected to be zero. Thereafter, the magnification error is kept at zero according to the accurate prediction value on the basis of the duty ratio DT.

In this embodiment, exposure is performed when the data $\Delta Y(tj)$ is measured. Under this assumption, adjustment under barometric control is performed. However, the barometric value may be kept zero (760 mmHg) until time Tr while production of the new prediction value is started from Ti. In this case, the magnification change data $\Delta Y(tj)$ of the wafer follows the characteristic curve EV4 in FIG. 10B. If the value on the basis of the characteristic curve EV3 is subtracted from the measured data on the basis of the characteristic curve EV4, the data values $\Delta Y(t1)$, $\Delta Y(t2)$, $\Delta Y(t3)$ and $\Delta Y(t4)$ on the basis of the decline characteristic curve in FIG. 10B can be calculated. The value on the basis of the characteristic curve EV3 solely corresponds to the new prediction value from time Ti.

In the above embodiments, the barometric value P is reset to zero (760 mmHg) at time Ti. However, the data $\Delta Y(tj)$ may be actually measured while the barometric value P is kept at the value (P1) at the time of a power failure or overrunning, thereby obtaining the same effect as in the above embodiments. Even in this case, the new prediction value after time Ti must be obtained while time Ti is given as the initial time (zero). In the above embodiments, after the magnification change values are measured, they are used for restoring (correcting) barometric control. However, the correction data as the measured values may be input to an automatic focusing system for vertically moving the wafer. In this case, focal point changes caused by incident light on the projection lens can also be accurately corrected. Furthermore, instead of measuring the magnification change values by using the slit photoelectric detector and the alignment optical system on the stage, a method of measuring the focal point change values may be utilized to obtain the same effect as in the previous embodiments. In order to practice this method, a flat reference plate is arranged at a stage position different from that of the wafer. The stage is vertically moved while a TTL (Though-The-Lens) system operates, to focus the projected reticle image on the reference plate. In the just-in-focus state, the vertical positions of the stage can be sequentially measured at discrete moments. Although the state of light incident on the projection lens is calculated on the basis of the duty ratio of the shutter, only the open or closed state of the shutter may be detected for every time interval (e.g., 1 msec) shorter than then the opening or closing time (e.g., 50 msec) of the shutter, thereby obtaining the prediction value by high-speed processing in the same manner as in the case of FIG. 3.

If correction control such as barometric control or focal point control is performed on the basis of the new prediction value (inaccurate) during measurements upon energization of the system, the measured values correspond to the correction values for the accurate prediction values. Therefore, arithmetic operations can be simplified.

What is claimed is:

1. A projection exposure apparatus comprising:
   means for supplying light energy for illuminating an object;
   a projection optical system employing light energy supplied from the illuminated object to form an image of said object on a workpiece;
   means for prestoring first data relating to changes in imaging characteristics of said projection optical system caused by heat absorption and radiation of said optical system;
   means for measuring valves of an imaging characteristic of said projection optical system at plural discrete moments during a measurement period and producing second data representing deviations of respective measured values from designed values; and
   a control system adapted to maintain imaging characteristics of said projection optical system, said control system including predicting means for predicting changes in imaging characteristics of said projection optical system according to a formula having parameters determined on the basis of said first and second data, and means for adjusting the positional relation between said image and said workpiece on the basis of the predicted changes, said control system including means for causing said measuring means to produce said second data when data required to determine parameters of said formula is insufficient to permit said predicting means to predict said changes in imaging characteristics of said projection optical system according to said formula.

2. An apparatus according to claim 1, wherein said first data comprises a time constant relating to changes in imaging characteristics.

3. An apparatus according to claim 2, wherein said measuring means compares said respective measured values with designed values to determine said deviations.

4. An apparatus according to claim 1, wherein said adjusting means controls said projection optical system to adjust said imaging characteristics.

5. An apparatus according to claim 4, wherein said imaging characteristics comprise a magnification of said projection optical system.

6. An apparatus according to claim 4, wherein said projection optical system includes a plurality of lens elements, at least one space being formed between said plurality of lens elements, said adjusting means including means for controlling a pressure within the space.

7. In a projection exposure apparatus provided with (i) a projection optical system employing light energy from an illuminated object to form an image of the object on a workpiece, (ii) means for monitoring the light energy supplied to said projection optical system, (iii) means for prestoring a time constant relating to changes in imaging characteristics of said projection optical system caused by heat absorption and radiation of said optical system, (iv) means for predicting changes in said imaging characteristics on the basis of a relationship among said time constant, an output from said monitoring means, and a time lapse, and (v) means for adjusting the positional relation between said image and said workpiece on the basis of an output from said predicting means, a method for adjusting a state of the object image on said workpiece when said relationship has been interrupted, comprising the steps of:

(a) measuring values of an imaging characteristic of said projection optical system at plural discrete moments during a measurement period, said measuring being performed when said relationship has been interrupted;

(b) determining deviations of respective measured values from designed values to product data representing corresponding change values of said imaging characteristics;

(c) determining said relationship on the basis of said prestored time constant and said data; and (d) adjusting the positional relation between said image and said workpiece according to the determined relationship.

8. A method according to claim 7, wherein a formula which has parameters determined on the basis of said output from said monitoring means, said time constant, and said data is used by said predicting means to predict changes in said imaging characteristics.

9. A method according to claim 7, wherein said adjusting of said positional relation comprises controlling said projection optical system to adjust said imaging characteristics.

10. A method according to claim 9, wherein said imaging characteristics comprise a magnification of said projection optical system.

11. A method according to claim 9, wherein said imaging characteristics comprise a focal point of said projection optical system.

* * * * *